United States Patent
Pelly

(10) Patent No.: US 6,211,567 B1
(45) Date of Patent: Apr. 3, 2001

(54) TOP HEATSINK FOR IGBT

(75) Inventor: Brian R. Pelly, Palos Verdes Estates, CA (US)

(73) Assignee: International Rectifier Corp., El Segundo, CA (US)

( * ) Notice: Subject to any disclaimer, the term of this patent is extended or adjusted under 35 U.S.C. 154(b) by 0 days.

(21) Appl. No.: 09/232,491

(22) Filed: Jan. 15, 1999

Related U.S. Application Data

(60) Provisional application No. 60/071,988, filed on Jan. 20, 1998.

(51) Int. Cl.7 .................................................. H01L 23/10
(52) U.S. Cl. ......................... 257/707; 257/341; 257/712; 257/720
(58) Field of Search .................................... 257/341, 370, 257/706, 707, 712, 720

(56) References Cited

U.S. PATENT DOCUMENTS

| | | | |
|---|---|---|---|
| 4,965,710 | * 10/1990 | Pelly et al. | 363/56 |
| 5,786,230 | * 7/1998 | Anderson et al. | 437/209 |
| 5,966,291 | * 10/1999 | Baumel et al. | 361/707 |
| 6,031,723 | * 2/2000 | Wieloch | 361/719 |

OTHER PUBLICATIONS

Kwok K. Ng, Complete Guide to Semiconductor Devices 1995, AT&T Bell Laboratories NJ, 356.*

* cited by examiner

*Primary Examiner*—Eddie C. Lee
*Assistant Examiner*—Lourdes Cruz
(74) *Attorney, Agent, or Firm*—Ostrolenk, Faber, Gerb & Soffen, LLP

(57) ABSTRACT

A massive heat slug in thermally coupled to the top of an IGBT to act as a local thermal inertia element to absorb and store heat from the die during peak temperature rise and to return heat to the die at reduced die temperature, thereby reducing the ratio of die peak temperature to die average temperature. The device is useful in applications in which the IGBT is called upon to carry current at a range of frequencies which includes very low (eg 3 Hz) frequencies as in a motor control circuit.

18 Claims, 2 Drawing Sheets

TYPICAL JUNCTION TO CASE TEMPERATURE (TJ-C)
FLUCTUATION AT 3Hz OUTPUT FREQUENCY

TOP HEATSINK FOR IGBT

CROSS REFERENCE TO RELATED APPLICATION

This application is based on and claims priority to U.S. Provisional Patent Application Ser. No. 60/071,988, filed Jan. 20, 1998, entitled TOP HEATSINK FOR IGBT, the entire disclosure of which is incorporated herein by reference.

FIELD OF THE INVENTION

This invention relates to IGBTs which have high thermal capacitance and more specifically relates to IGBTs which are particularly useful for motor controller application. A very thick heatsink is in contact with the junction or top side of an IGBT die surface to act as a thermal capacitance for the die.

BACKGROUND OF THE INVENTION

Insulated gate bipolar transistors (IGBTs) are commonly used in the inverter circuit section of motor drive circuits. Inverter circuits of this kind are shown, for example, in U.S. Pat. No. 5,825,641.

When the motor of a motor drive circuit turns very slowly, the power output of the inverter is at very low frequency, for example, 3 Hz. The relationship between IGBT transient thermal impedance and its peak junction temperature rise is a function of the output frequency of the motor drive inverter. The same output current is generally required at all output frequencies. The rated output current of an IGBT die for a particular circuit is, therefore, limited to that obtainable at the lowest output motor current frequency, typically 3 Hz, since the junction temperature is at its highest at this frequency. More specifically, while the IGBT device will switch at a frequency between 1 KHz to 20 KHz, the meter current which it carries may have a frequency as low as 3 Hz at slow spaced rotation.

If the transient thermal impedance can be reduced, the ratio of peak to average junction temperature will be reduced, and increased output current can be obtained at 3 Hz for a given IGBT die.

More specifically, the ratio between peak and average junction temperature at 3 Hz can be approximated as:

$$\frac{T_{JPK}}{T_{JAV}} = 1 + 2.2 \frac{R_{th75ms}}{R_{thDC}},$$

where $R_{th75ms}$ is the transient thermal resistance for a 75 ms current pulse and $R_{thDC}$ is the DC thermal resistance of the IGBT. $T_{JPK}$ is the peak junction temperature and $T_{JAV}$ is the average junction temperature. For IGBT devices presently made by the International Rectifier Corporation of El Segundo, Calif., $R_{th75ms}/R_{thDC}$ is about 0.8, which gives $T_{JPK}/T_{JAV}=2.8$. It would be desirable to reduce the transient thermal resistance since that would allow the use of a smaller die for a given motor controller application.

BRIEF DESCRIPTION OF THE INVENTION

Transient thermal resistance is reduced, in accordance with the invention, by placing a thermal mass on the top of the IGBT die within its package. The system of die and mass and package then has a thermal inertia, or thermal capacitance. This is preferably achieved by soldering or otherwise thermally connecting a slug of copper, or other material, to the top of the die. The die may have a solderable top metal as shown, for example, in U.S. Pat. No. 5,047,833, entitled Solderable Front Metal Contact for MOS Device, in the name of Gould.

It can be estimated that a 0.2 inch×0.2 inch area, 0.4 inch high copper slug soldered to the top of a size 5 IGBT die (sold by the International Rectifier Corporation of El Segundo, Calif.) would give a reduction in $T_{JPK}/T_{JAV}$ from the present value of 2.76 to 1.22. This would yield a corresponding increase in inverter output current capability of about 80% for the same die size.

Less dramatic, but still significant increases in output current would be achieved with a less thick slug. For example, a 0.1 inch slug would give a reduction in $T_{JPK}/T_{JAV}$ of 1.88/2.76=0.68, and a corresponding increase in output current of about 20%.

DETAILED DESCRIPTION OF THE DRAWINGS

Figure 1:
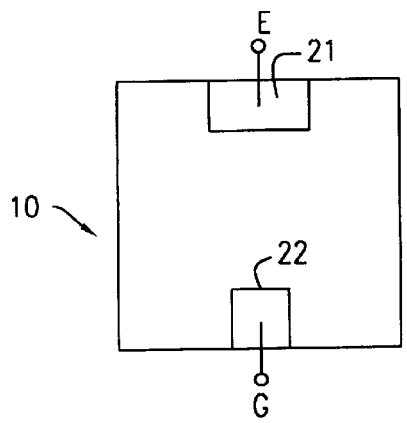
FIG. 1 shows a top view of a typical IGBT die.
Figure 2:
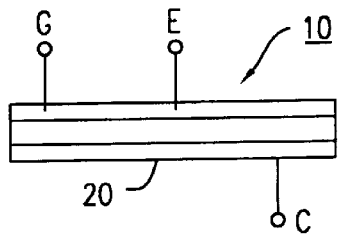
FIG. 2 is a side view of FIG. 1.
Figure 3:
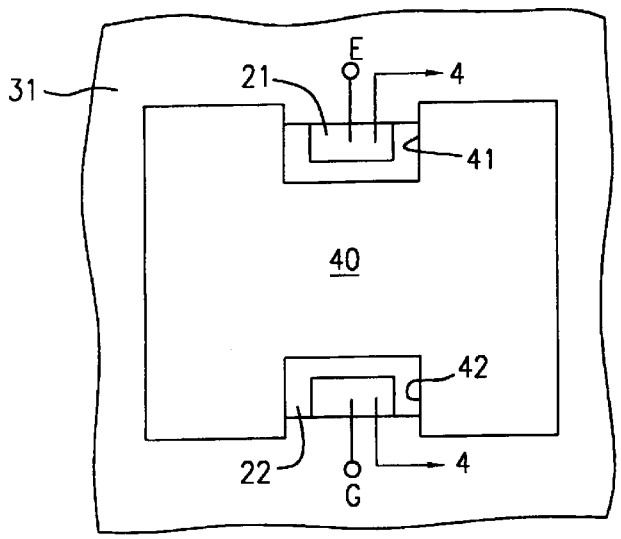
FIG. 3 is a top view of a copper slug atop the surface of the die of FIGS. 1 and 2.

Referring first to FIGS. 1 and 2, there is shown an IGBT die 10 which may be a size 3 IGBT die which is sold by the International Rectifier Corporation of El Segundo, Calif. The die has a bottom collector contact 20, and has an emitter contact pad 21 and a gate contact pad 22 on its upper surface. The upper surface may be solderable, as described in U.S. Pat. No. 5,047,833 to Gould. Note that the present invention is also applicable to other semiconductor die, for example, diodes thyristors, power MOSFETs and MOSgated thyristors.

Figure 4:
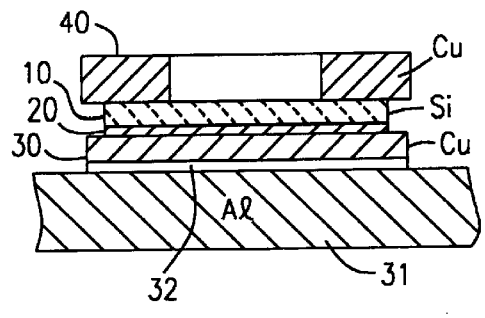
FIG. 4 is a cross-section of FIG. 3 taken across section line 4—4 in FIG. 3.

In a conventional application, the IGBT die 10 is supported by soldering, or the like, on an IMS substrate as shown in FIG. 4. Thus, the IMS substrate has a patterned copper layer 30 which is atop a thin insulation layer 32 which is fastened to an aluminum base plate 31. It should be noted that other support surfaces and packages can be used with die adopted with the present invention. Further, it should be noted that the IGBT die can be copacked with antiparallel diode devices and the like, and that such diodes can also be provided with heat slugs of the kind described herein.

The die contact 20 is then soldered or otherwise connected (as by a conductive epoxy) atop copper layer 30. In accordance with the invention top conductive slug 40 is then soldered, or otherwise thermally connected to the top of die 20. Slug 40 is preferably copper. Slots 41 and 42 in slug 40 enable access to the bonding pads 21 and 22.

Slug 40 is preferably thicker than about 0.08 inch and is at least as large in area as the die 20.

As previously described, for a present IGBT die without the added slug or heatsink of the invention, $R_{th75ms}$ is 0.8 and $T_{JPK}/T_{JAV}$ is 2.76. For a slug of thickness 0.08 inch and up to 0.4 inch, these values are shown in the following table:

| CU Slug Thickness (in) | $R_{th75ms}$ (Thermal Resistance) | $T_{JPK}/T_{JAV}$ (Peak Temperature Reduction) |
| --- | --- | --- |
| 0.4 | 0.1 | 1.22 |
| 0.2 | 0.2 | 1.44 |
| 0.133 | 0.3 | 1.66 |
| 0.1 | 0.4 | 1.88 |
| 0.08 | 0.5 | 2.1 |

Figure 5:
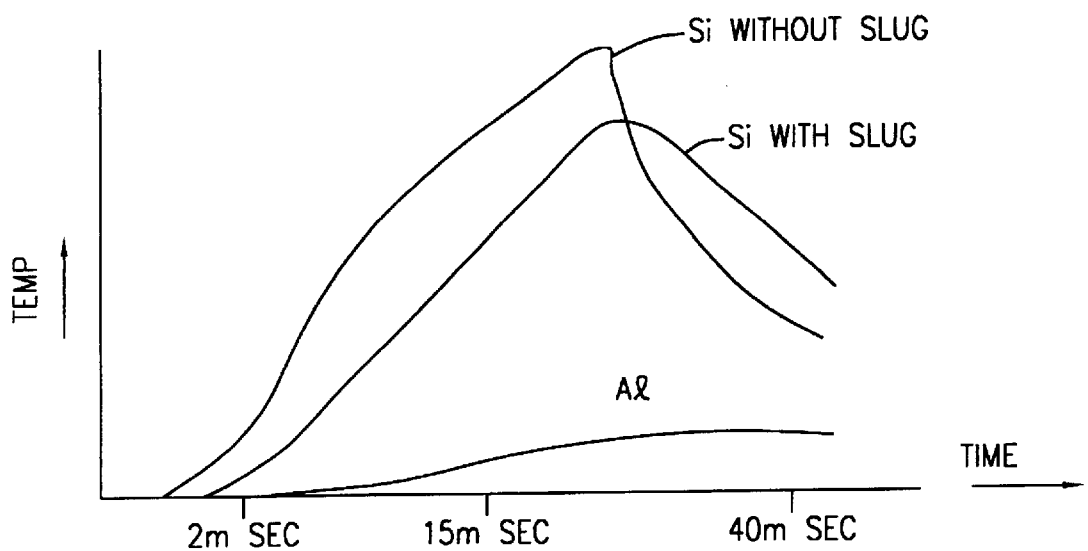
FIG. 5 shows curves of the temperature rise of a silicon die with and without respectively a top mounted heatsink for a pulsed input current.

FIG. 5 shows the reduction in temperature rise for a simulated 50 millisecond power pulse into a size 3 IGBT having a copper slug 20 mm$^2$ in area and 1.25 mm high atop the die. It will be noted that the added thermal mass causes a substantial reduction in peak temperature rise.

Viewing the invention in other words, the peak junction to case temperature rise of an IGBT in a PWM inverter for motor control increases as the output frequency decreases, because at low frequency the instantaneous junction temperature has time to follow the instantaneous fluctuations of power dissipation.

Figure 6:
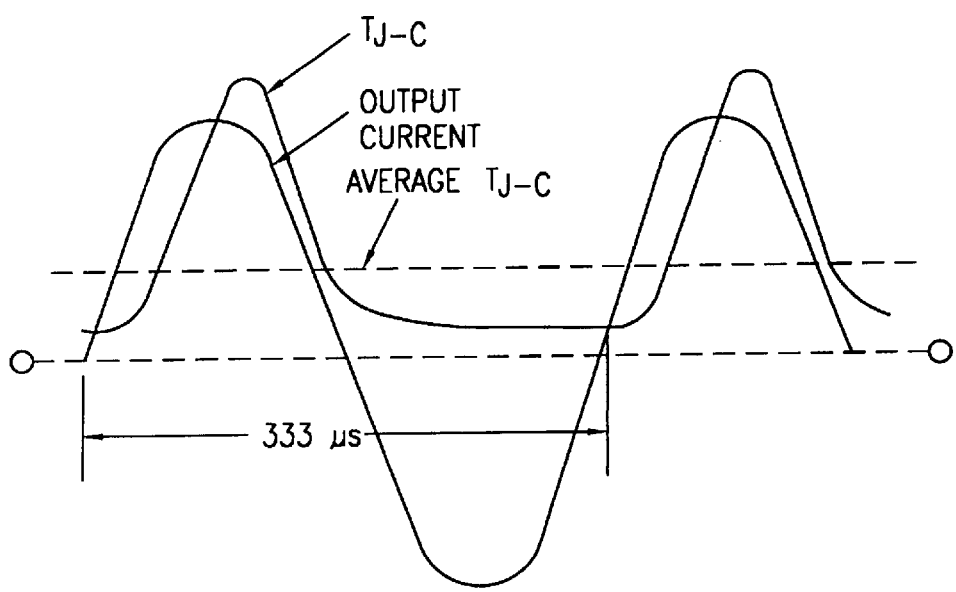
FIG. 6 shows the typical junction-to-use temperature fluctuation at 3 Hz output frequency.

Typical junction temperature fluctuation at 3 Hz—assumed to be the lowest output frequency at full current—for an IGBT with normal transient thermal impedance characteristic, is shown in FIG. 6.

The average junction temperature rise equals the DC thermal resistance multiplied by the average power dissipation, but the peak rise is more than 2.5 times the average value. Thus, the effective DC thermal resistance for design purposes at 3 Hz is more than 2.5 times the actual DC value.

The transient thermal impedance, hence also the effective DC thermal resistance at low output frequency, is reduced by adding the "heat slug" 40, previously described, to the top of the silicon die. The function of the heat slug 40 is to absorb heat from the junction during peaks of power and return it during valleys, smoothing instantaneous fluctuations of temperature.

The heat slug 40 is not required or intended to transmit heat to the outside world, (though it does not hurt if it does); rather, its function is to provide local thermal inertia closest to the heat-generating part of the silicon. This is similar to the function of a capacitor in smoothing voltage ripple.

Thus, though the heat slug 40 does not reduce actual DC thermal resistance, it does reduce the transient value, hence it reduces the effective design thermal resistance at 3 Hz, which governs peak junction temperature.

In a further example, it is estimated that a 0.2 inch cube copper slug mounted on top of a size 5 IGBT would lower the transient impedance at 75 ms from 0.8 to 0.2° C./W. The corresponding effective thermal resistance at 3 Hz would be reduced from about 2.8 to 1.4° C./W—i.e., a reduction of 2:1.

The foregoing description of the preferred embodiments of the present invention have been provided for the purposes of illustration and description. It is not intended to be exhaustive or to limit the invention to the precise forms disclosed. Many modifications and variations are possible in light of the above teaching. It is intended that the scope of the invention not be limited to this detailed description, but rather by the claims appended hereto.

What is claimed is:

1. An IGBT for a motor control circuit which can drive a motor in a range of speed including very low speeds requiring the IGBT to carry at least a portion of the motor output current which has a frequency of about 3 Hz and greater;

said IGBT comprising a silicon die having IGBT junctions formed in its top surface to define emitter and gate regions and having a collector electrode on its opposite surface;

said collector electrode being at least thermally coupled to a support surface;

and a heat slug having a thermal conductivity substantially greater than a thermal conductivity of said die;

said heat slug being thermally coupled to said emitter region of said die for absorbing and storing heat from said die during peak temperature conditions of said die, and returning heat to said die during reduced die temperature conditions, thereby to reduce a ratio comprising a peak temperature of the die junctions to an average temperature of the die junctions, substantially without reducing DC thermal resistance, said heat slug standing alone and not contacting any metallic part of said IGBT other than said emitter region.

2. The structure of claim 1, wherein said heat slug is made of copper.

3. The structure of claim 2, wherein said heat slug is thicker than about 0.08 inch and has an area which is substantially coextensive with the area of said die.

4. The structure of claim 1, wherein said ratio is less than about 2.1.

5. The structure of claim 2, where said ratio is less than about 2.1.

6. The structure of claim 3, where said ratio is less than about 2.1.

7. An IGBT comprising a die having IGBT junctions formed in its top surface to define emitter and gate regions and having a collector electrode on its opposite surface;

and a heat slug having a thermal conductivity substantially greater than a thermal conductivity of said die;

said heat slug being thermally coupled to said emitter region of said die for absorbing heat from said die during peak temperature conditions of said die, and returning heat to said die during reduced die temperature conditions, thereby to reduce a ratio comprising a peak temperature of the die junctions to an average temperature of the die junctions, substantially without reducing DC thermal resistance, said heat slug standing alone and not contacting any metallic part of said IGBT other than said emitter region.

8. The structure of claim 7, wherein said heat slug is made of copper.

9. The structure of claim 8, wherein said heat slug is thicker than about 0.08 inch and has an area which is substantially coextensive with the area of said die.

10. The structure of claim 7, wherein said ratio is less than about 2.1.

11. The structure of claim 8, wherein said ratio is less than about 2.1.

12. The structure of claim 9, wherein said ratio is less than about 2.1.

13. A semiconductor device comprising a silicon die having first and second parallel spaced surfaces and being p-n junctions formed into said first surface and having conductive electrodes on said first and second surfaces;

and a heat slug of thermal conductivity which is greater than that of said die;

said heat slug defining a thermal heatsink mass and being thermally coupled to said first surface for absorbing and storing heat from said die during peak temperature conditions of said die, and returning heat to said die during reduced die temperature conditions, thereby to reduce a ratio comprising a peak temperature of the die junctions to an average temperature of the die junctions, substantially without reducing DC thermal resistance, said heat slug standing alone and not contacting any metallic part of said IGBT other than said emitter region.

14. The semiconductor device of claim 13 wherein said p-n junctions define a device selected from the group consisting of IGBTs, diodes, MOSFETs and thyristors.

15. The structure of claim 13, wherein said heat slug is made of copper.

16. The structure of claim 15, wherein said heat slug is thicker than about 0.08 inch and has an area which is substantially coextensive with the area of said die.

17. The structure of claim 15, wherein said ratio is less than about 2.1.

18. The structure of claim 16, wherein said ratio is less than about 2.1.

* * * * *